(12) United States Patent
Furukawa et al.

(10) Patent No.: US 11,934,096 B2
(45) Date of Patent: Mar. 19, 2024

(54) FRAME MEMBER FOR ELECTRON BEAM LITHOGRAPHY DEVICE AND ELECTRON BEAM LITHOGRAPHY DEVICE

(71) Applicant: KYOCERA Corporation, Kyoto (JP)

(72) Inventors: Shigenobu Furukawa, Koka (JP); Koji Akashi, Hikone (JP)

(73) Assignee: KYOCERA CORPORATION, Kyoto (JP)

( * ) Notice: Subject to any disclaimer, the term of this patent is extended or adjusted under 35 U.S.C. 154(b) by 510 days.

(21) Appl. No.: 17/288,321

(22) PCT Filed: Oct. 23, 2019

(86) PCT No.: PCT/JP2019/041520
§ 371 (c)(1),
(2) Date: Apr. 23, 2021

(87) PCT Pub. No.: WO2020/090580
PCT Pub. Date: May 7, 2020

(65) Prior Publication Data
US 2021/0375579 A1     Dec. 2, 2021

(30) Foreign Application Priority Data

Oct. 29, 2018  (JP) ................................. 2018-202938
May 15, 2019  (JP) ................................. 2019-091940

(51) Int. Cl.
*G03F 1/78*   (2012.01)
*G03F 7/20*   (2006.01)
*H01J 37/305* (2006.01)

(52) U.S. Cl.
CPC .............. *G03F 1/78* (2013.01); *G03F 7/2002* (2013.01); *H01J 37/305* (2013.01)

(58) Field of Classification Search
CPC .......... G03F 1/78; G03F 7/2002; H01J 37/20; H01J 37/305; H01J 37/3174; H01J 2237/004; H01J 2237/0262; H01L 21/027
USPC ....................................... 250/492.2
See application file for complete search history.

(56) References Cited

U.S. PATENT DOCUMENTS 5,801,073 A  *  9/1998  Robbins ................. H01L 23/13
                                                   438/126
5,834,840 A  * 11/1998  Robbins .............. H01L 21/4807
                                                   257/713
2008/0054195 A1   3/2008  Tachikawa
2011/0155930 A1   6/2011  Kawaguchi et al.

FOREIGN PATENT DOCUMENTS

| JP | 2008-058809 A | 3/2008 |
| JP | 2011-134974 A | 7/2011 |
| JP | 2013-229463 A | 11/2013 |

* cited by examiner

*Primary Examiner* — Kiet T Nguyen
(74) *Attorney, Agent, or Firm* — Procopio, Cory, Hargreaves Savitch LLP

(57) ABSTRACT

A frame member for an electron beam lithography device of the present disclosure includes a frame body comprising sapphire or aluminum oxide-based ceramics having an open porosity of 0.2% or less and a conductive film disposed at least on a main surface of an electron gun side of the frame body.

12 Claims, 3 Drawing Sheets

FRAME MEMBER FOR ELECTRON BEAM LITHOGRAPHY DEVICE AND ELECTRON BEAM LITHOGRAPHY DEVICE

TECHNICAL FIELD

The present disclosure relates to a frame member for an electron beam lithography device used in preparing a mask for an exposure device or the like and an electron beam lithography device.

BACKGROUND ART

In a semiconductor manufacturing step and a flat panel display (FPD) manufacturing step, an exposure device such as a stepper is used to form a circuit pattern on a semiconductor wafer and a glass substrate. A mask (reticle) is used in the exposure device to form the circuit pattern on the semiconductor wafer and the glass substrate. This mask is prepared by irradiating a substrate such as a mask blank with an electron beam to draw the circuit pattern, using an electron beam lithography device as shown in Patent Document 1.

In the electron beam lithography device, a frame member (substrate cover) having a conductive layer on the surface is disposed so as to overlap the outer peripheral part of the substrate in order to prevent the substrate from being electrostatically charged. The frame member is required to generate few particles, efficiently release electrons from the substrate, and be resistant to electrostatic charge on the frame member.

For example, Patent Document 2 discloses a frame member in which an alumina film and a conductive film are laminated on a frame body composed of an alumina sintered body obtained by normal pressure sintering. According to such a frame member, electrons on the substrate can be efficiently released by the conductive film, and contamination of the substrate by particles from the alumina sintered body can be reduced. However, with the recent high density of circuit pattern or the like, further reduction of particles is required for the mask preparation while maintaining suppression of electrostatic charge.

PRIOR ART DOCUMENTS

Patent Documents

Patent Document 1: Japanese Unexamined Patent Publication No. 2008-58809
Patent Document 2: Japanese Unexamined Patent Publication No. 2013-229463

SUMMARY OF THE INVENTION

Problem to be Solved by the Invention

The present disclosure aims to provide a frame member for an electron beam lithography device and an electron beam lithography device that further reduce a generation of particles while maintaining suppression of electrostatic charge.

Means for Solving the Problem

The frame member for the electron beam lithography device of the present disclosure includes a frame body composed of sapphire or aluminum oxide-based ceramics having an open porosity of 0.2% or less, and a conductive film disposed at least on a main surface of an electron gun side of the frame body.

The electron beam lithography device of the present disclosure includes the above frame member for the electron beam lithography device.

Effects of the Invention

According to the present disclosure, it is possible to provide a frame member for an electron beam lithography device and an electron beam lithography device that further reduce the generation of particles while maintaining suppression of electrostatic charge.

EMBODIMENTS FOR CARRYING OUT THE INVENTION

<Electron Beam Lithography Device and Frame Member>

Figure 1:
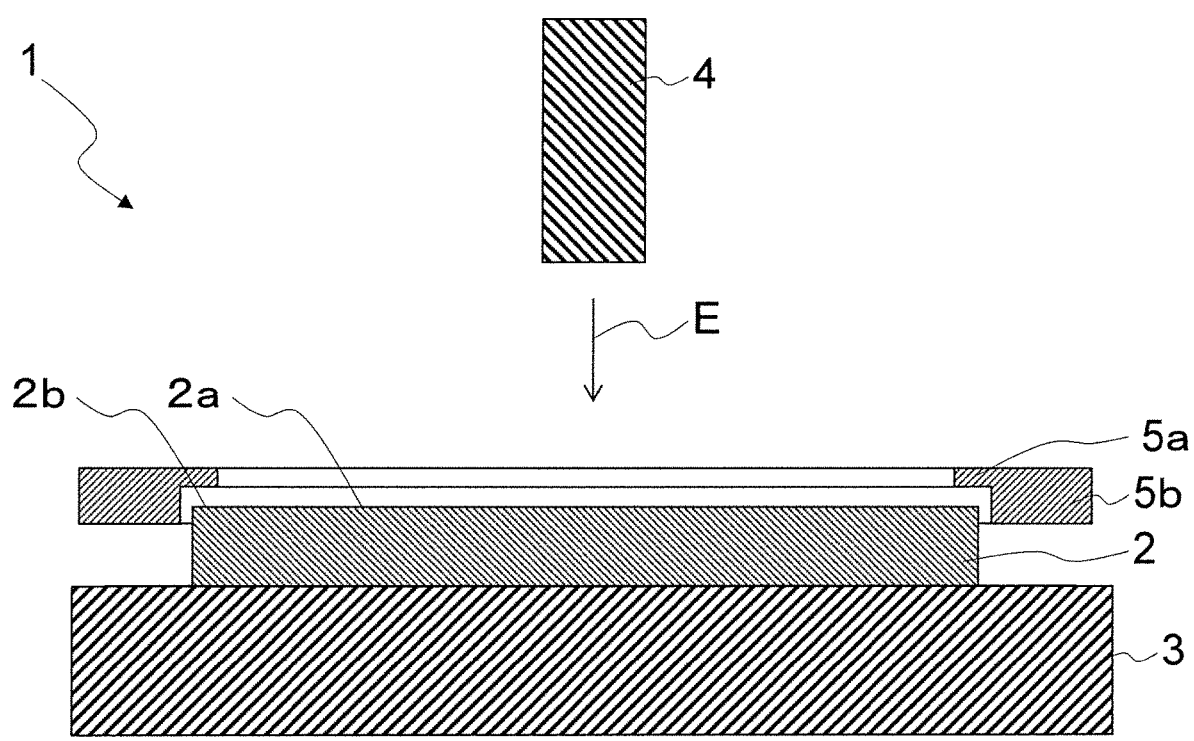
FIG. 1 is a sectional view illustrating a configuration example of an electron beam lithography device using a frame member of the present disclosure.

A frame member 5 for the electron beam lithography device of the present disclosure (hereinafter referred to simply as "frame member 5") is explained with reference to the figures. FIG. 1 is a sectional view illustrating a configuration example of an electron beam lithography device 1 using the frame member 5 of the present disclosure.

The electron beam lithography device 1 includes a mounting member 3 for placing a substrate 2, an electron gun 4 for irradiating an electron beam E to the substrate 2, and the frame member 5 that is disposed so as to cover an outer peripheral region 2b of the substrate 2. Here, the substrate 2 is a workpiece. The electron beam lithography device 1 prepares a mask for an exposure device by irradiating the substrate 2 with the electron beam E to draw and form a pattern for exposure.

The substrate 2 is, for example, a mask blank that includes a glass substrate and an inorganic thin film such as metal, metal oxide or metal nitride formed on the glass substrate. The pattern for exposure is formed by irradiating the inorganic thin film with the electron beam E to draw. A region where the pattern for exposure is formed in the center of the substrate 2 is a central region 2a, and a region surrounding the central region 2a is the outer peripheral region 2b.

The mounting member 3 is, for example, an XY stage, which can position the substrate 2 at a desired position. The electron gun 4 is a device that emits electrons into space, accelerates them by means of an electric field, converges them into a beam of electrons E, and irradiates the beam of electrons E to the desired position on the substrate 2.

Figure 2A:
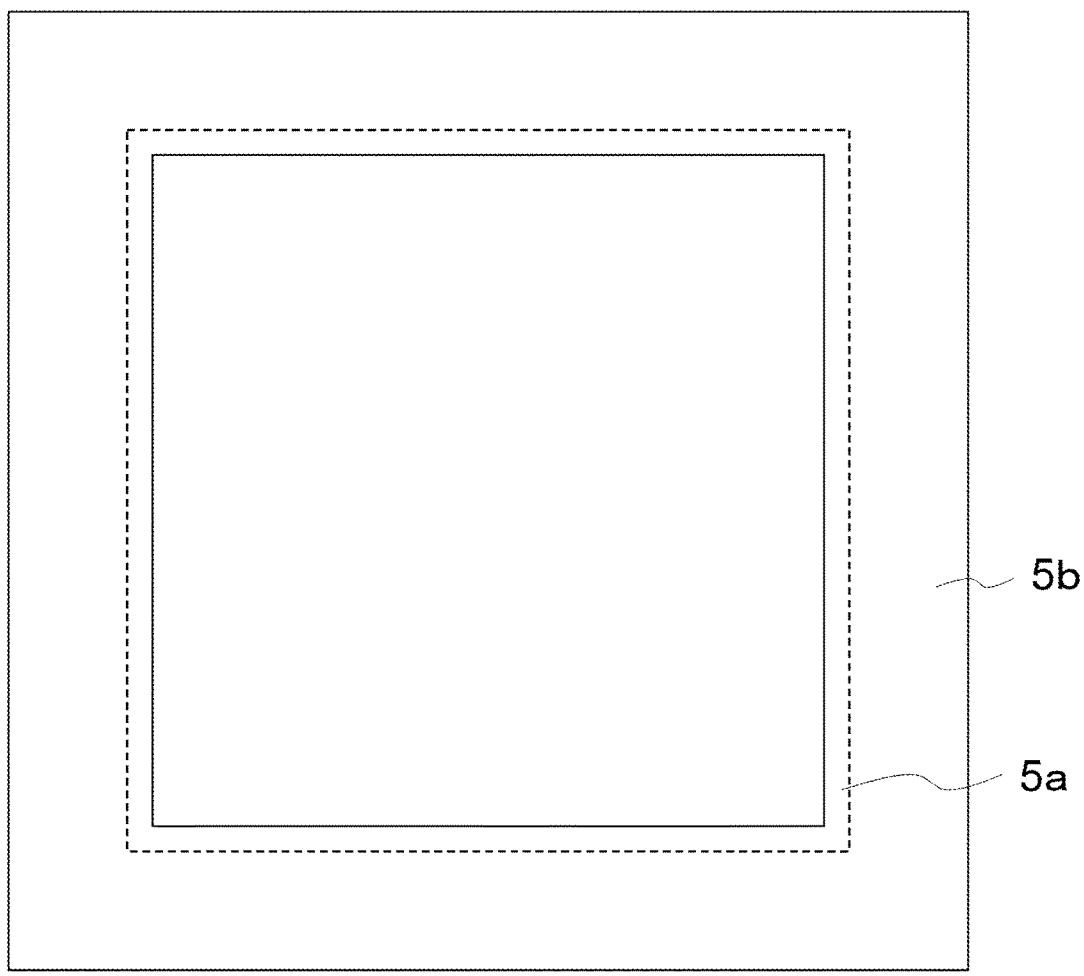
FIG. 2 illustrates a schematic of a frame member of the present disclosure, where (a) is a plan view, (b) is a sectional view, and (c) is an enlarged view of A part shown in (b).
Figure 2B:
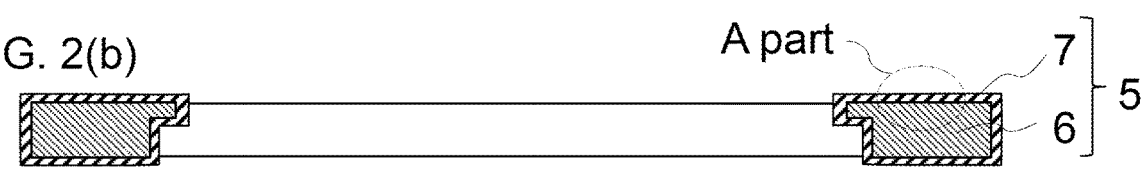
Figure 2C:
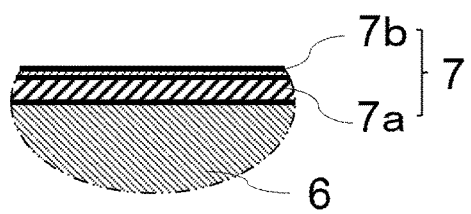

FIG. 2 illustrates a schematic of the frame member of the present disclosure, where (a) is a plan view, (b) is a sectional view, and (c) is an enlarged view of A part shown in (b). The frame member 5 includes a frame body 6 which is composed of sapphire or aluminum oxide-based ceramics having the open porosity of 0.2% or less, and a conductive film 7 which is disposed on the surface of the frame body 6. Sapphire is a single crystal alumina. Aluminum oxide-based ceramics is ceramics that contains 96% by mass or more of aluminum oxide out of 100% by mass of components constituting the aluminum oxide-based ceramics.

Each component is identified by an X-ray diffractometer, and the content of each component may be converted into oxides, carbides, or nitrides, depending on the identified component, with the content of the element obtained by X-ray fluorescence spectrometer (XRF) or ICP (Inductively Coupled Plasma) emission spectrometer (ICP). The open porosity of aluminum oxide-based ceramics can be determined using JIS R 1634:1998 (Archimedes method).

The frame member 5 is a frame-shaped member having an opening for irradiating the electron beam E to the substrate 2 and is disposed at a distance from the outer peripheral region 2b while covering the outer peripheral region 2b of the substrate 2 in plan view. The electron beam E passes through the opening and reaches the central region 2a of the substrate 2, where the pattern for exposure is drawn. However, the electron beam E is shielded by the frame member 5 and does not reach the outer peripheral region 2b of the substrate 2. The frame member 5 is grounded, and the frame member 5 and the substrate 2 are electrically connected via an electrical contact such as a ground pin (not shown). As a result, the electrostatic charge on the substrate 2 is removed through the frame member 5.

The frame member 5 is L-shaped in cross section along the thickness direction. The frame member 5 has an eaves-shaped first part 5a, which is disposed on the outer peripheral region 2b of the substrate 2, and a second part 5b, which is thicker than the first part 5a and surrounds the outside of the first part 5a. The surfaces of the electron gun 4 side of the first part 5a and the second part 5b are flush (flat with no step between the two surfaces). A back surface of a first region 5a is a stepped surface that connects to an inner side surface of a second region 5b and is disposed so as to be separated from and opposed to the outer peripheral region 2b of the substrate 2. The second region 5b extends lower than the first part 5a and is disposed so that its inner side surface is separated from and opposed to a side surface of the substrate 2.

The frame body 6 is the main part of the frame member 5, ensures the mechanical strength and rigidity of the frame member 5, and suppresses deformation and damage of the frame member 5. Sapphire and aluminum oxide-based ceramics having the open porosity of 0.2% or less have superior mechanical strength and rigidity and are suitable for the frame body 6. Aluminum oxide-based ceramics having an open porosity of 0.2% or less can be obtained by hot hydrostatic pressing treatment after normal pressure sintering, and sapphire and the above aluminum oxide-based ceramics generate very few particles compared to ceramics obtained by normal pressure sintering alone.

The conductive film 7 is a film that covers the surface of the frame body 6 and is exposed to the surface of the frame member 5. If the substrate 2 or the frame member 5 becomes electrostatically charged due to the irradiation of electron beam E, the accuracy of drawing by the electron beam E decreases. The conductive film 7 removes the electrostatic charge from the substrate 2 and frame member 5. If the frame body 6 is ceramics obtained only by normal pressure sintering, there are many open pores existing on the surface of the frame body 6 and grain boundary phases having a large concavity to the surface, and the conductive film 7 cannot fully cover these open pores and grain boundary phases, which may cause electrostatic charging. In the frame member 5 of the present disclosure, since the frame body 6 is composed of sapphire or aluminum oxide-based ceramics having the open porosity of 0.2% or less, the open pores existing on the surface and the grain boundary phases having a large concavity to the surface are reduced, and the covering by the conductive film 7 becomes better, so that the frame member 5 is less likely to be electrostatically charged. Therefore, the electron beam lithography device 1 can improve the accuracy of drawing by the electron beam E.

To further improve the accuracy of drawing by the electron beam E, the total content of ferromagnetic metals (for example, iron, cobalt, nickel, or the like) may be 0.1% by mass or less in relation to 100% by mass of the components that constitute the frame body 6. This is because when the ferromagnetic metals are in this range, the electron beam E is less likely to be adversely affected. The content of ferromagnetic metals can be determined by an ICP emission spectrophotometer.

The conductive film 7 is disposed at least on the main surface of the electron gun 4 side of the frame body 6. It is desirable to be formed on the back surface of the first part 5a and the side surface of the second part 5b that are opposed to the substrate 2, and furthermore, it is desirable to be formed over the entire surface of the frame member 5.

The conductive film 7 may include a first layer 7a mainly composed of titanium, which is formed on the frame body 6, and a second layer 7b mainly composed of a compound of titanium, which is disposed on the first layer 7a. In this way, when the first layer 7a mainly composed of titanium is interposed between the frame body 6 and the second layer 7b mainly composed of a compound of titanium, the bonding strength between the frame body 6 and the second layer 7b can be increased. Because the exposed surface of the conductive film 7 is composed of the second layer 7b mainly composed of a compound of titanium, deterioration of the conductive performance due to oxidation of the first layer 7a can be suppressed. In addition, the second layer 7b has a higher hardness than the first layer 7a, which helps to suppress damage to the exposed surface of the conductive film 7.

The thickness of the first layer 7a is, for example, 0.1 μm or more and 0.5 μm or less. The thickness of the second layer 7b is, for example, 0.1 μm or more and 10 μm or less. The main component in the first layer 7a and the second layer 7b means a component that accounts for 90% by mass or more of the total 100% by mass of components constituting the respective layers. The second layer 7b is mainly composed of, for example, titanium nitride, titanium carbide, titanium carbonitride, or titanium oxide lacking oxygen from the stoichiometric composition.

The content of each metal component included in the first layer 7a and the second layer 7b may be determined using the X-ray fluorescence spectrometer (XRF) or ICP emission spectrophotometer. The components of the compounds constituting the second layer 7b may be identified using the X-ray diffractometer (XRD), and the content of the metal components may be converted to the content of the component of the identified compound.

The substrate 2 is irradiated with a large amount of electron beam E. The conductive film 7 is preferably semi-conductive. The conductive film 7 has a conductivity greater than or equal to the degree that an electrostatic charge is not generated during electron beam lithography. For example, a sheet resistance of the conducive film 7 is $5 \times 10^7 \Omega/\square$ or less. In particular, if the sheet resistance of the conductive film 7 is $5 \times 10^5 \Omega/\square$ or less, the electrostatic charge of the substrate 2 and the frame member 5 can be quickly removed. The thickness of the conductive film 7 is preferably 0.1 μm or more and 10 µm or less. The thickness of the conductive film 7 is 0.1 µm or more, which can prevent the frame body 6 from being electrostatically charged more effectively. In addition, the thickness of the conductive film 7 is 10 µm or less, which can further suppress peeling due to film stress caused by film formation. The sheet resistance can be determined in accordance with ASTM F 390-11.

If a fractured layer is formed on the surface of the frame body 6 by mechanical processing, it becomes a cause of particle generation and electrostatic charges. Therefore, the fractured layer may be removed by etching, CMP (chemical mechanical polishing), or the like. In particular, the main surface of the electron gun 4 side of the frame body 6 is exposed to the electron beam E, thus a high-precision surface finish is required. If an arithmetic mean roughness Ra of the main surface of the electron gun 4 side of the frame body 6 is 1 nm or less, particles and electrostatic charges are less likely to occur. The arithmetic mean roughness Ra of the main surface of the electron gun 4 side may be measured using the 3D optical surface profiler "NEW VIEW" (registered trademark by Zygo Corporation).

The frame body 6 includes the inner side surface that faces the workpiece and the stepped surface that is connected to the inner side surface and faces the workpiece, and the arithmetic mean roughness Ra of at least one of the inner side surface and the stepped surface may be 0.01 µm or more and 1 µm or less. If the arithmetic mean roughness Ra of at least one of the inner side surface and the stepped surface of the frame body 6 is 0.01 µm or more, the surface has an increased surface area, which makes it easier to capture electrons that stay in the outer peripheral region 2b and the side surface of the substrate 2. On the other hand, if the arithmetic mean roughness Ra of at least one of the inner side surface and the stepped surface of the frame body 6 is 1 µm or less, crystal grains are less likely to be degrained from the surface and particle scattering can be suppressed. The arithmetic mean roughness Ra can be obtained in accordance with JIS B 0601:1994, where the radius of the probe may be 5 µm, the material of the probe may be diamond, the measurement length may be 1.25 mm, and the cutoff value may be 0.25 mm.

The first part 5a is thinner and more easily broken than the second part 5b. If streak-shaped concavo-convex is formed on the back surface of the first part 5a in the direction from the inner side surface to the second part 5b, the mechanical strength of the first part 5a is improved.

A Vickers hardness of a frame body 6 may be 17 GPa or higher. If the Vickers hardness of the frame body 6 is in this range, the chipping resistance is higher, thus when forming the conductive film 7, chipping is less likely to occur from the main surface, and the adhesion strength of the conductive film 7 to the frame body 6 can be relatively uniformly high. In particular, the Vickers hardness of the frame body 6 may be 20 GPa or higher. The Vickers hardness can be determined according to JIS R 1610:2003 (ISO 14705:2000 (MOD)), and a testing force may be 9.807N.

The three-point bending strength of the frame body 6 may be 380 MPa or higher. If the three-point bending strength is in this range, the rigidity is high, and the frame body 6 is less likely to be deformed even if it becomes large, so it can be used for a long period of time. The three-point bending strength of the frame body 6 is preferred to be 600 MPa or higher. In particular, the three-point bending strength of the frame body 6 is preferred to be 580 MPa or higher. The three-point bending strength can be determined in accordance with JIS R 1601:2008 (ISO 14704:2000 (MOD)).

If the frame body 6 is composed of sapphire, the main surface may be a-plane. When the main surface is the a-plane, the a-plane is harder than c-plane and m-plane, therefore it is less likely to produce a fractured layer even when impacted. As a result, the generation of particles can be suppressed. The crystal orientation of the main surface can be obtained by using the X-ray diffractometer.

If the frame body 6 is composed of aluminum oxide-based ceramics, the main surface of the electron gun 4 side may have a plurality of open pores, and the value (A) obtained by subtracting the mean value of the circle equivalent diameter of the open pores from the mean value of the distance between the centers of gravity of the open pores may be 42 µm or more and 85 µm or less. If the above value (A) is 42 µm or more, the distance between the open pores that inhibit heat conduction becomes wider, so heat dissipation is further maintained even when exposed to rising and falling temperatures. If the above value (A) is 85 µm or less, the conductive film 7 can easily penetrate into the open pores during a manufacturing step to obtain an anchoring effect, and the conductive film 7 that obtains an anchoring effect further improves adhesion to the frame body 6. The distance between the centers of gravity of the open pores can be determined by the method below.

First, the surface layer part which is within 0.6 mm in the depth direction from the main surface of the electron gun 4 side in aluminum oxide-based ceramics is polished on a copper plate using a diamond abrasive grain whose average particle size $D_{50}$ is 3 µm. The polished surface is then obtained by polishing with a tin plate using the diamond abrasive grain whose average particle size $D_{50}$ is 0.5 µm. By these polishing processes, the conductive film 7 formed on the frame body 6 is also removed, and the arithmetic mean roughness Ra of the polished surface can be set to 0.01 µm or more and 0.2 µm or less. The arithmetic mean roughness Ra of the polished surface is the same as the measurement method described above.

An observation image is obtained by observing the polished surface at 200× magnification and selecting an average range, for example, the range with an area of 0.105 mm² (374 µm in the horizontal direction and 280 µm in the vertical direction), and photographing it with a CCD camera. Using this observation image, the distance between the centers of gravity of the open pores can be determined by the distance between centers of gravity method of dispersion measurement using the image analysis software "A Zou Kun (ver. 2.52)" (registered trademark, manufactured by Asahi Kasei Engineering Corporation). Hereinafter, when the image analysis software "A Zou Kun" is described, it indicates the image analysis software manufactured by Asahi Kasei Engineering Corporation.

The setting conditions for this method are, for example, a threshold value, which is an indicator of the lightness and darkness of the image, may be 86, the lightness may be dark, the small figure removal area may be 1 µm², and the noise reduction filter may be present. The threshold value may be adjusted according to the brightness of the observation image. Setting the brightness as dark, the binarization method as manual, the small figure removal area as 1 µm², and the noise reduction filter as present, the threshold value may be adjusted so that the marker appearing in the observation image matches the shape of the pore.

A circle equivalent diameter of the open pores can be determined by the method below. From the above observation image, the circle equivalent diameter of the open pores can be determined using a technique called particle analysis. The setting conditions for this method may also be the same as those used for the distance between centers of gravity method of dispersion measurement.

The mean value of the circle equivalent diameter of the open pores is 0.3 μm or less, and the variation coefficient of the circle equivalent diameter may be 0.4 or less. If the mean value and the variation coefficient of the circle equivalent diameter of the open pores are in this range, the open pores become smaller and their variations decrease, therefore, the residual stress that causes peeling of the conductive film 7 is less likely to become locally large.

If the frame body 6 is composed of aluminum oxide-based ceramics, the content of aluminum oxide in the aluminum oxide-based ceramics may be 99.999% by mass or more. When the content of aluminum oxide is in this range, the fractured layer is less likely to be produced from the frame body 6 even if a large amount of electron beam E is irradiated toward the substrate 2. Therefore, it can be used as the frame body 6 for a long period of time. The content of aluminum oxide is determined by using glow discharge mass spectrometer (GDMS) to determine the content of elements other than aluminum oxide, and is a value excluding the sum of the content of each of these elements.

<Method for Manufacturing the Frame Member>

Hereafter, the method for manufacturing the frame member 5 is explained. First, a case where the frame body 6 is composed of sapphire is explained. A long sapphire grown by a growing method such as the Czochralski (CZ) method and the edge-defined film-fed (EFG) method is cut to obtain a plate sapphire. The crystal orientation of the plate sapphire is, for example, the a-plane for the main surface and the c-plane and the m-plane for the side surfaces.

Next, the opening is formed in the plate sapphire by laser processing or the like, and then the frame body 6 is obtained by cutting. If the first part 5a is formed by cutting from the inner side surface rather than from the back surface side, moderate concavo-convex surfaces can be obtained on the back surface of the first part 5a, and the mechanical strength of the first part 5a can be improved. When the main surface of the plate sapphire is the a-plane, the sapphire is less likely to crack if it is cut from the inner side surface rather than from the main surface side.

Next, a case where the frame body 6 is composed of the aluminum oxide-based ceramics is explained. First, aluminum oxide powder (a purity of 99.9% by mass or more) which is the main component and each powder of magnesium hydroxide, silicon oxide, and calcium carbonate are fed into a grinding mill together with a solvent (ion-exchange water). After grinding the powder until the average particle size ($D_{50}$) is 1.5 μm or less, an organic binder and a dispersant to disperse the aluminum oxide powder are added and mixed to obtain a slurry.

Here, the content of magnesium hydroxide powder in the total 100% by mass of the above powders is 0.43 to 0.53% by mass, silicon oxide powder is 0.039 to 0.041% by mass, calcium carbonate powder is 0.020 to 0.071% by mass, and the remainder is the aluminum oxide powder and unavoidable impurities. To make the total content of ferromagnetic metals 0.1% by mass or less for the 100% by mass of the components that constitute a frame body, a de-ironing process may be applied using a de-ironing machine. Organic binders include, for example, acrylic emulsions, polyvinyl alcohol, polyethylene glycol, polyethylene oxide, and the like.

Next, the slurry is spray-granulated to obtain granules, and then pressurized with a cold hydrostatic pressurizer at a molding pressure of 78 Mpa or more and 128 MPa or less to obtain a plate-shaped molded body. Next, after forming the opening in the plate-shaped molded body by cutting or the like, the sintered body can be obtained by firing the molded body with a firing temperature being 1500° C. or more and 1600° C. or less, a firing atmosphere being an air atmosphere, and a holding time being 4 hours or more and 6 hours or less.

The frame body 6 composed of aluminum oxide-based ceramics with an open porosity of 0.2% or less can be obtained by heat-treating this sintered body using a hot hydrostatic pressurizer with a heat treatment temperature of 1300° C. or more and 1500° C. or less, a heat treatment atmosphere of argon atmosphere, and a pressure of 90 MPa or more and 300 MPa or less. To obtain a frame body composed of aluminum oxide-based ceramics having a Vickers hardness of 17 GPa or higher or a three-point bending strength of 380 MPa or higher, it may be heat-treated with a heat treatment temperature of 1300° C. or more and 1600° C. or less, an atmosphere of the heat treatment as argon atmosphere, and a pressure as 100 MPa or more and 300 MPa or less.

To obtain a frame body composed of aluminum oxide-based ceramics in which the main surface of the electron gun side has a plurality of open pores and a value (A) obtained by subtracting the mean value of the circle equivalent diameter of the open pores from the mean value of the distance between the centers of gravity of the open pores is 42 μm or more and 85 m or less, the molded body is fired at a firing temperature of 1500° C. or more and 1600° C. or less, a firing atmosphere of air atmosphere, and a holding time of 5 hours or more and 6 hours or less. After firing the molded body, it may be heat-treated with a heat treatment temperature of 1300° C. or more and 1600° C. or less, an atmosphere of the heat treatment as argon atmosphere, and a pressure as 90 MPa or more and 300 MPa or less.

To obtain a frame body composed of aluminum ceramics whose mean value of the circle equivalent diameter of the open pores is 0.3 μm or less and the variation coefficient of the circle equivalent diameter is 0.4 or less, the molded body is fired with the average particle size (D50) of the above powder being 1.2 μm or less, the firing temperature being 1500° C. or more and 1600° C. or less, the firing atmosphere being an air atmosphere, and the holding time being 5 hours or more and 6 hours or less. After firing the molded body, it may be heat-treated with a heat treatment temperature of 1300° C. or more and 1600° C. or less, an atmosphere of the heat treatment as argon atmosphere, and a pressure as 90 MPa or more and 300 MPa or less.

To obtain aluminum oxide-based ceramics whose content of aluminum oxide is 99.999% by mass or more, the aluminum oxide powder having a purity of 99.999% by mass or more is fed into a grinding mill together with a solvent (ion-exchange water) and ground until the average particle size ($D_{50}$) of the powder is 1.5 μm or less. Then, the organic binder and the dispersant to disperse the aluminum oxide powder are added and mixed to obtain the slurry. After that, molding, firing, and heat treatment may be performed sequentially using the manufacturing methods described above.

Next, a surface and a back surface of the frame body 6 composed of sapphire or aluminum oxide-based ceramics obtained by the manufacturing method described above are subjected to a lapping process using the diamond abrasive grain. Then, the fractured layer is removed from the surface by CMP process using a colloidal silica abrasive grain and processed so as to obtain an arithmetic mean roughness Ra of 1 nm or less, for example, 0.3 nm or less. After that, the inner side surface and the stepped surface of the frame body 6 are processed by a method such as magnetic fluid polishing so as to obtain an arithmetic mean roughness Ra of 0.01 μm or more and 1 μm or less, for example, 0.1 μm or less.

Specifically, one magnet (not shown) is disposed on the outside of the frame body 6, and magnetic grains and slurry abrasive grains are fed into the opening. The magnet may be moved in the thickness direction of the frame body 6 by rotating it. By polishing in this way, the inner side surface and the stepped surface of the frame body 6 are polished. The magnet is provided so as to direct the direction of the magnetic field along the thickness direction of the frame body 6, and powdered magnetic grains composed of magnetic materials such as iron, nickel, cobalt, and specially processed stainless steel are inserted into the opening.

The particle size of the magnetic grains is, for example, 0.1 mm or more and 1.5 mm or less. The first layer 7a, which is mainly composed of titanium, and the second layer 7b, which is mainly composed of a compound of titanium, are sequentially formed at least on the main surface of the electron gun 4 side of the frame body 6, using the ion plating method. In this way, the frame member 5 can be obtained.

Although the frame member of the present disclosure is described above, the present disclosure is not limited to the embodiments described above. Various improvements and changes may be made without departing from the scope of the present disclosure.

EXAMPLES

As an Example, the surface of the frame body 6 composed of sapphire was lapped to obtain the frame member 5 in which the first layer 7a mainly composed of titanium and the second layer 7b mainly composed of titanium nitride were disposed on the surface.

As a comparative example, the surface of the frame body 6 composed of aluminum oxide-based ceramics obtained by normal pressure sintering was lapped to obtain the frame member 5 in which the first layer 7a mainly composed of titanium and the second layer 7b mainly composed of titanium nitride were disposed on the surface. Both conductive films 7 were irradiated with an electron beam, and the charging status was compared by SEM (Scanning Electron Microscope) photographs.

Figure 3A:
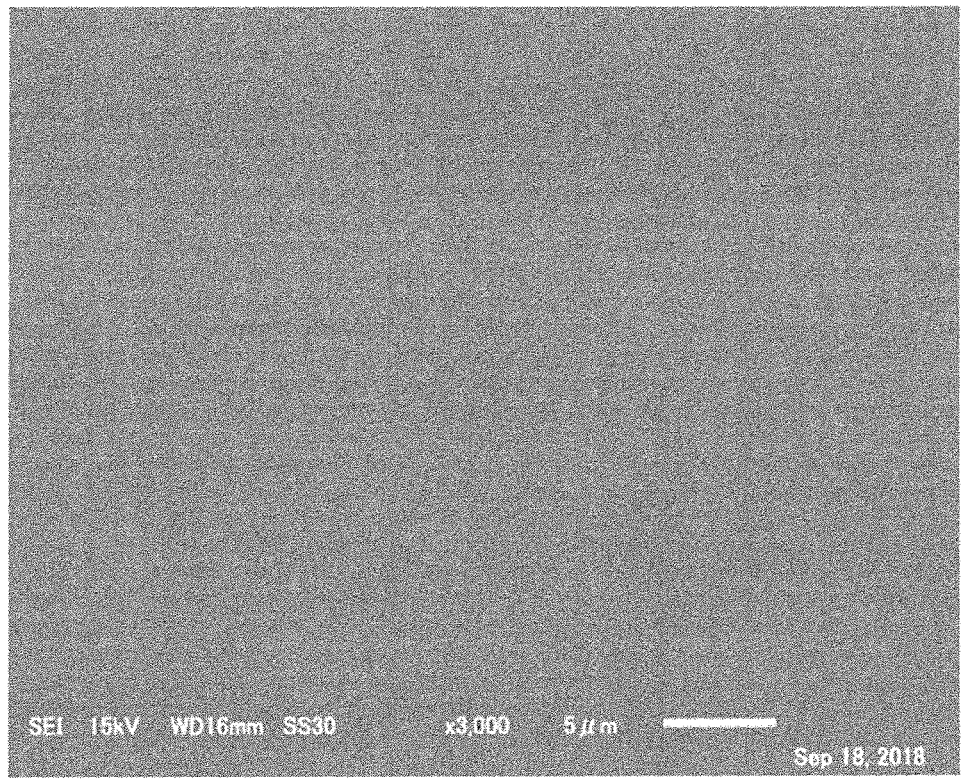
FIG. 3 is a SEM photograph of a first layer when irradiated with an electron beam, where (a) is an Example and (b) is a comparative example.
Figure 3B:
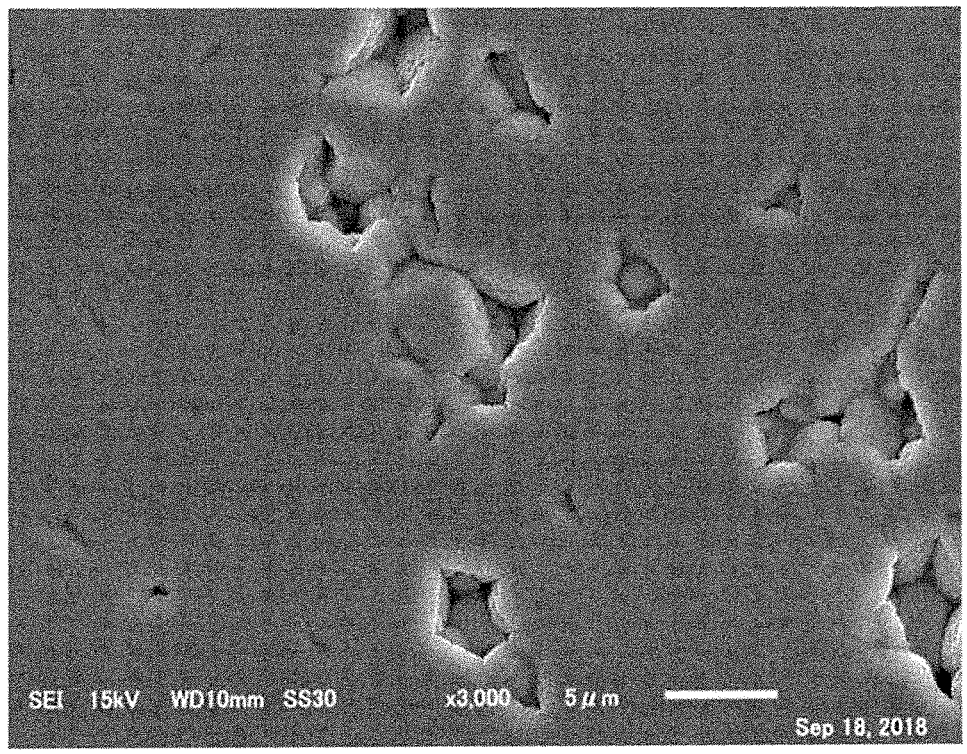

FIG. 3 is a SEM photograph of the first layer when irradiated with an electron beam, where (a) is the Example and (b) is the comparative example. In the comparison example, the conductive film 7 cannot completely cover the open pores on the surface of the frame body 6, and a part of the contours of the pores show charge-up due to whitening. This indicates that electrostatic charges are generated.

On the other hand, in the Example, the pores themselves do not exist. Therefore, there is no charge-up, and no such electrostatic charges are observed.

DESCRIPTION OF THE REFERENCE NUMERAL 1 electron beam lithography device
2 substrate (workpiece)
2a central region
2b outer peripheral region
3 mounting member (stage)
4 electron gun
5 frame member (substrate cover)
5a first part
5b second part
6 frame body
7 conductive film
7a first layer
7b second layer

The invention claimed is:

1. A frame member for an electron beam lithography device comprising:
   a frame body comprising sapphire or aluminum oxide-based ceramics having an open porosity of 0.2% or less, and
   a conductive film disposed at least on a main surface of an electron gun side of the frame body.

2. The frame member for the electron beam lithography device according to claim 1, wherein the conductive film comprises a first layer mainly composed of titanium, and disposed on the frame body, and a second layer mainly composed of a compound of titanium, and disposed on the first layer.

3. The frame member for the electron beam lithography device according to claim 1, wherein a sheet resistance of the conductive film is $5 \times 10^5 \Omega/\square$ or less.

4. The frame member for the electron beam lithography device according to claim 1, wherein an arithmetic mean roughness Ra of the main surface of an electron gun side of the frame body is 1 nm or less.

5. The frame member for the electron beam lithography device according to claim 1, wherein the frame body comprises an inner side surface facing a workpiece and a stepped surface that is connected to the inner side surface and facing the workpiece, and
   an arithmetic mean roughness Ra of at least one of the inner side surface and the stepped surface is 0.01 μm or more and 1 μm or less.

6. The frame member for the electron beam lithography device according to claim 1, wherein a Vickers hardness of the frame body is 17 GPa or higher.

7. The frame member for the electron beam lithography device according to claim 1, wherein a three-point bending strength of the frame body is 380 MPa or higher.

8. The frame member for the electron beam lithography device according to claim 1, wherein the frame body comprises sapphire, and the main surface is a-plane.

9. The frame member for the electron beam lithography device according to claim 1, wherein the frame body comprises aluminum oxide-based ceramics, a main surface of the electron gun side has a plurality of open pores, and a value (A) obtained by subtracting a mean value of a circle equivalent diameter of the open pores from a mean value of a distance between the centers of gravity of the open pores is 42 μm or more and 85 m or less.

10. The frame member for the electron beam lithography device according to claim 9, wherein a mean value of a circle equivalent diameter of the open pores is 0.3 μm or less, and a variation coefficient of the circle equivalent diameter is 0.4 or less.

11. The frame member for the electron beam lithography device according to claim 1, wherein the frame body comprises aluminum oxide-based ceramics, and a content aluminum oxide in the aluminum oxide-based ceramics is 99.999% by mass or more.

12. An electron beam lithography device comprising:
   the frame member for the electron beam lithography device according to claim 1.

* * * * *